United States Patent
Tu et al.

(10) Patent No.: US 8,188,898 B2
(45) Date of Patent: May 29, 2012

(54) INTEGRATED CIRCUITS, LIQUID CRYSTAL DISPLAY (LCD) DRIVERS, AND SYSTEMS

(75) Inventors: Nang-Ping Tu, Hsinchu (TW); Fu-Long Hsueh, Cranbury, NJ (US); Mingo Liu, Hsinchu (TW); I-Fey Wang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 128 days.

(21) Appl. No.: 12/762,535

(22) Filed: Apr. 19, 2010

(65) Prior Publication Data
US 2011/0032129 A1      Feb. 10, 2011

Related U.S. Application Data

(60) Provisional application No. 61/232,200, filed on Aug. 7, 2009.

(51) Int. Cl.
*H03M 1/66* (2006.01)

(52) U.S. Cl. .......................................... 341/144; 345/94
(58) Field of Classification Search .................. 341/122, 341/141, 144
See application file for complete search history.

(56) References Cited

U.S. PATENT DOCUMENTS

| | | | |
|---|---|---|---|
| 6,940,496 B1 * | 9/2005 | Kim ............................. | 345/204 |
| 2002/0100925 A1 * | 8/2002 | Hsiao et al. .................. | 257/258 |
| 2004/0125067 A1 * | 7/2004 | Kim et al. ...................... | 345/98 |
| 2006/0193002 A1 * | 8/2006 | Satou et al. ................. | 358/1.15 |
| 2006/0255994 A1 * | 11/2006 | Lin ............................. | 341/144 |

* cited by examiner

*Primary Examiner* — Howard Williams
(74) *Attorney, Agent, or Firm* — Lowe Hauptman Ham & Berner, LLP (57) ABSTRACT

An integrated circuit includes a digital-to-analog converter (DAC) circuit including at least one first channel type DAC and at least one second channel type DAC. The integrated circuit includes a plurality of sample and hold (S/H) circuits. Each of the S/H circuits is coupled with one of the DAC circuit. The S/H circuits are capable of receiving signals from the DAC circuit and outputting the signals in parallel.

20 Claims, 11 Drawing Sheets

INTEGRATED CIRCUITS, LIQUID CRYSTAL DISPLAY (LCD) DRIVERS, AND SYSTEMS

CROSS-REFERENCES TO RELATED APPLICATIONS

The present application claims priority of U.S. Provisional Patent Application Ser. No. 61/232,200, filed on Aug. 7, 2009, which is incorporated herein by reference in its entirety. The present application relates to TSMC2009-0331 commonly owned and assigned, and hereby incorporated by reference for all purposes.

TECHNICAL FIELD

The present disclosure relates generally to the field of semiconductor circuits, and more particularly, to integrated circuits, liquid crystal display (LCD) drivers, and systems.

BACKGROUND

Applications for semiconductor devices may use power devices, such as a liquid crystal display (LCD) driver. An LCD driver can operate at a high voltage to drive pixels of the LCD and at a low voltage to operate associated logic circuits. The LCD display driver can output a plurality of signals through channels for driving dots or pixels of the LCD for achieving a desired color-resolution display and a desired image moving speed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

For a conventional liquid crystal display (LCD) driver with 720 channels, the conventional LCD driver uses 720 digital-to-analog converters (DACs) for converting digital signals to analog signals. Each of the DACs is coupled with a channel. The analog signals are output to dots of the LCD, displaying images carried by the digital signals. Each three of the dots of the LCD can be grouped as a pixel, including a red-light dot, a green-light dot, and a blue-light dot.

It is found that the 720 DACs of the conventional LCD driver take around 30% chip area of the LCD driver. If a bit-resolution of the DACs increases, the area of the DACs expands abnormally. For example, an area of a 10-bit resolution DAC is about 4 times of an 8-bit resolution DAC. From the foregoing, to achieve a high resolution the 10-bit resolution DACs will consume more area of the LCD driver than the 8-bit resolution DACs.

Based on the foregoing, integrated circuits, liquid crystal display (LCD) drivers, and systems are desired.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1:
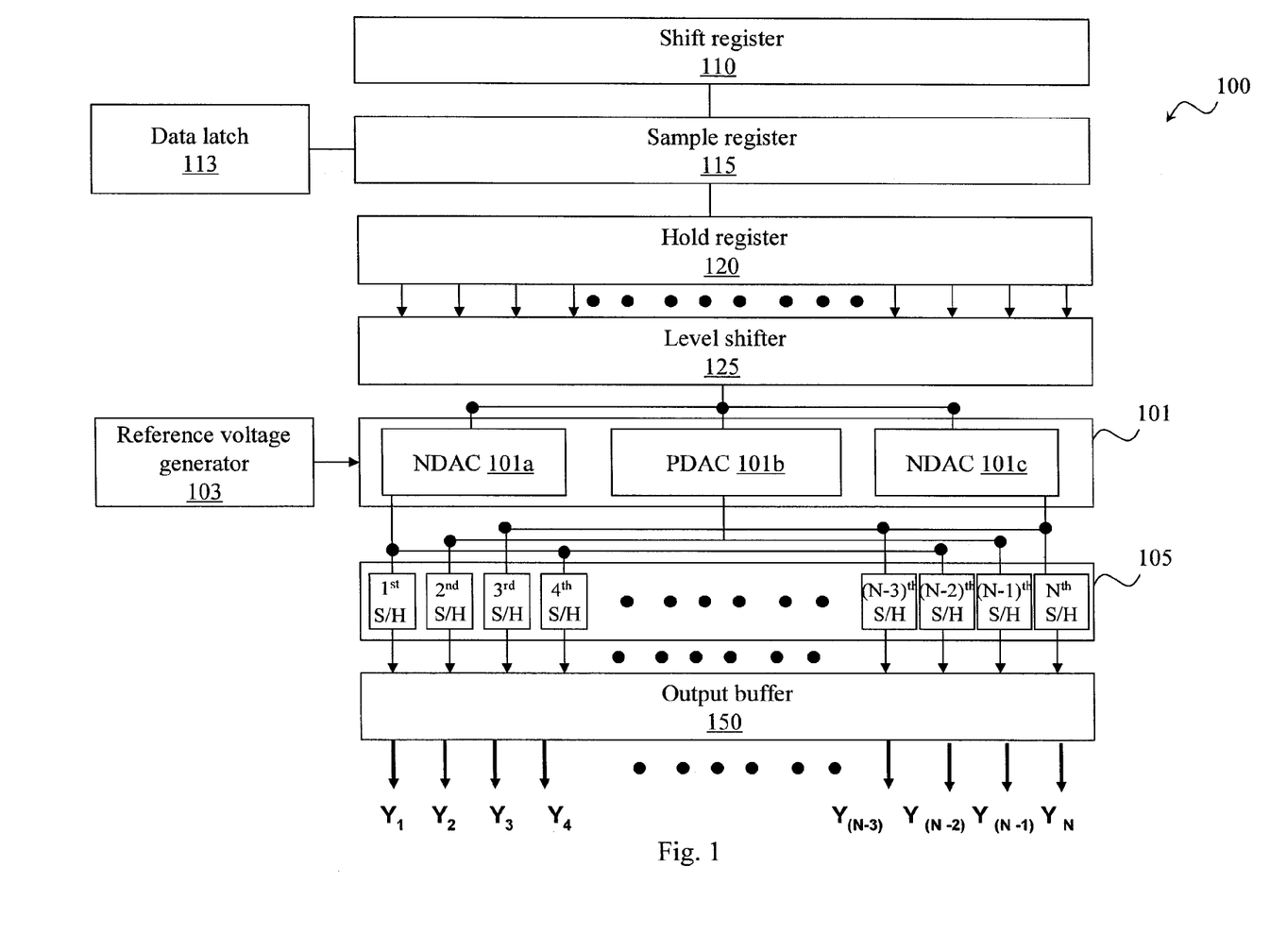
FIG. 1 is a schematic drawing showing an exemplary integrated circuit.

FIG. 1 is a schematic drawing showing an exemplary integrated circuit. An integrated circuit 100 can include a driver, e.g., a liquid crystal display (LCD) driver, an LCD monitor drivers, an LCD display drivers, an LCD inverter, a super twist pneumatic (STN) driver, and/or other driver. For embodiments using a LCD driver with N channels, the integrated circuit 100 can include a digital-to-analog converter (DAC) circuit 101. The DAC circuit 101 can include at least one first channel type digital-to-analog converter (DAC), e.g., N-channel type DACs (NDACs) 101a and 101c and at least one second channel type DAC, e.g., P-channel type DAC (PDAC) 101b. The DAC circuit 101 can convert digital signals, e.g., binary digital signals, to analog signals. It is noted that the channel types of the DACs described above are merely exemplary. In embodiments, the first channel type DAC can be PDAC and the second channel type DAC can be NDAC.

Referring to FIG. 1, the integrated circuit 100 can include a plurality of sample and hold (S/H) circuits 105. Each of the S/H circuits 105 can be coupled with one of the NDAC 101a and 101c and the PDAC 101b. The S/H circuits 105 can receive signals from the NDACs 101a and 101c and the PDAC 101b and outputting the signals in parallel. In embodiments using a LCD driver with N channels, the S/H circuits 105 can include N S/H circuits. Each of the S/H circuits 105 can be coupled with its corresponding channel.

As noted, the conventional LCD driver having N channels, e.g., 720 channels, uses 720 DACs for converting digital signals to analog signals. The 720 DACs may take up about 30% chip area of the conventional LCD driver.

Unlike the conventional LCD driver, the integrated circuit 100 can merely use 3 DACs, i.e., NDACs 101a, 101c, and PDAC 101b, for converting digital signals to analog signals. The signals output from the NDACs 101a and 101c and PDAC 101b can be held by the S/H circuits 105. At least one control signal can trigger the S/H circuits 105 outputting the signals from the NDACs 101a, 101c, and PDAC 101b. Since merely three DACs are used for converting digital signals to analog signals, the chip area of the integrated circuit 100 can be desirably reduced.

It is noted that the number of the NDACs 101a, 101c and the PDAC 101b of the DAC circuit 101 described above in conjunction with FIG. 1 is merely exemplary. In embodiments, the number of the DACs of the DAC circuit 101 can be 3n, wherein n is an integer from 1 to about 26. The more DACs the DAC circuit 101 has, the higher speed the integrated circuit 100 can achieve.

In embodiments, the integrated circuit 100 can include a reference voltage generator 103 coupled with the DAC circuit 101. The reference voltage generator 103 can provide various voltage levels to the DAC circuit 101 as reference voltages. In embodiments using a 10-bit resolution DAC, the reference voltage generator 103 can provide $2^{10}$ or 1024 voltage levels.

In embodiments using a LCD driver, the integrated circuit 100 can include a shift register 110, a data latch 113, a sample register 115, a hold register 120, a level shifter 125, and an output buffer 150. The data latch 113 can be coupled with the sample register 115. The shift register 110 can be configured to shift start pulses of input signals (not shown). The sample register 115 can be configured to sample the shifted signals from the shift register 110. The hold register 120 can configured to hold the sample signals from the sample register 115. The level shifter 125 can be configured to shift voltage levels of the signals output from the hold register 120, outputting the signals to the DAC circuit 101. The DAC circuit 101 can convert the signals to analog signals to the S/H circuits 105. The S/H circuits 105 can output the analog signals to the output buffer 150. The output buffer 150 can output analog signals $Y_1$-$Y_N$ for driving dots and/or pixels of the LCD. It is noted that the disposition and/or use of the shift register 110, the data latch 113, the sample register 115, the hold register 120, the level shifter 125, and the output buffer 150 described above in conjunction with FIG. 1 are merely exemplary. The scope of the invention is not limited thereto. It is also noted that the integrated circuit 100 may include at least one decoder and at least one DAC described in TSMC2009-0331 commonly owned and assigned, and hereby incorporated by reference for all purposes.

Figure 2:
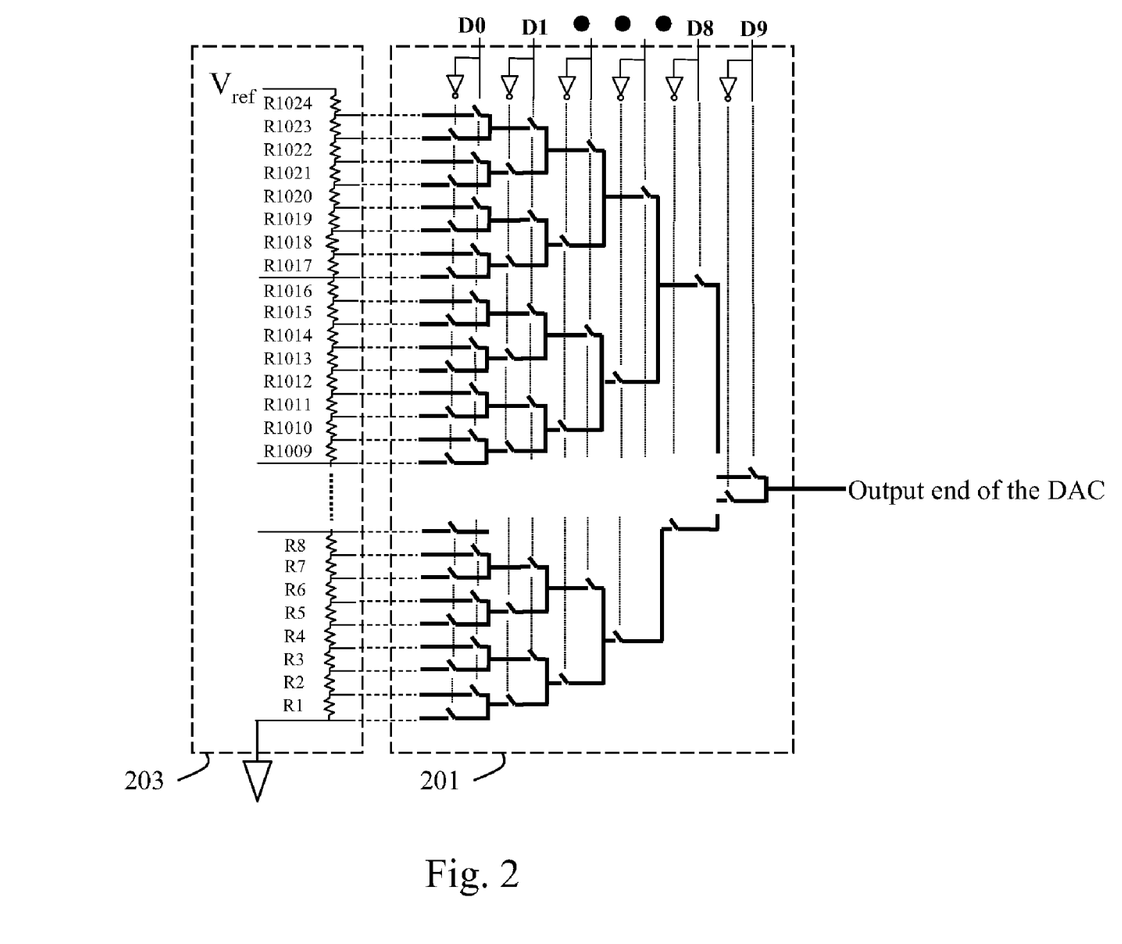
FIG. 2 is a schematic drawing illustrating an exemplary 10-bit resolution digital-to-analog converter (DAC) coupled with a reference voltage generator.

FIG. 2 is a schematic drawing illustrating an exemplary 10-bit resolution DAC coupled with a reference voltage generator. In FIG. 2, a 10-bit resolution DAC 201 can include at least one input end, e.g., 10 input ends, for receiving 10-bit binary digital signals D0-D9. The DAC 201 can be similar to one of the NDACs 101a and 101c and PDAC 101b. The DAC 201 can receive 1024 voltage levels provided from the reference voltage generator 203. The DAC 201 can include a plurality of switches (not labeled). Each of the switches can be controlled by one bit of the 10-bit binary digital signals D0-D9. Each of the 10-bit binary digital signals can turn on 10 switches for coupling one of the 1024 voltage levels to an output end of the DAC 201.

Figure 3:
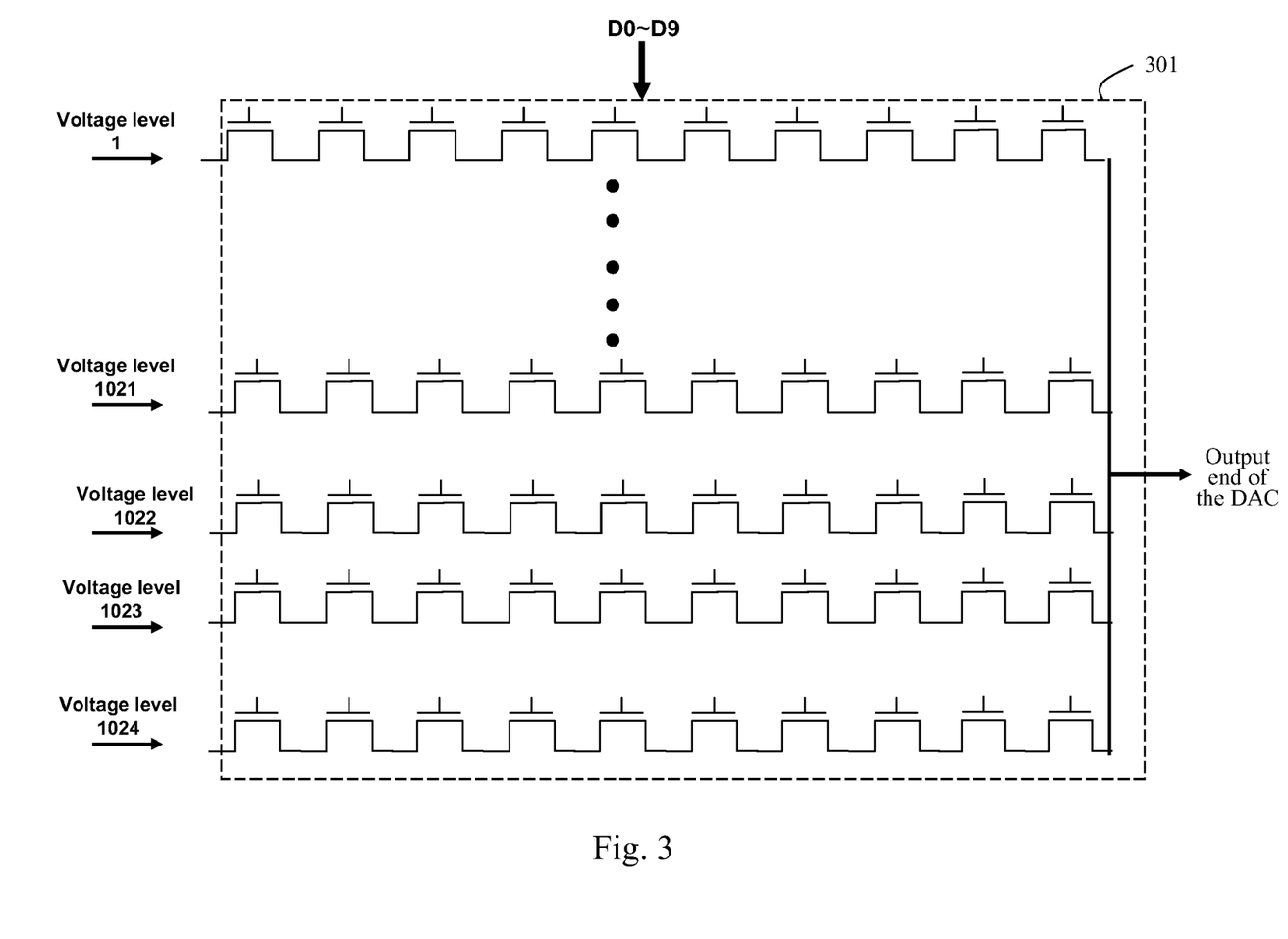
FIG. 3 is a schematic drawing illustrating another exemplary DAC with a 10-bit resolution.

FIG. 3 is a schematic drawing illustrating another exemplary DAC with a 10-bit resolution. In FIG. 3, a DAC 301 can include a plurality of rows of serial transistors. The DAC 301 can be similar to one of the NDACs 101a and 101c described above in conjunction with FIG. 1. For embodiments using a 10-bit resolution DAC, the DAC 301 have 1024 rows of serial transistors. Each row of the serial transistors can have 10 transistors coupled in series. Each row of the 10-series transistors can receive a voltage level. The DAC 301 can receive a 10-bit binary signal D0-D9. Each gate of the 10 transistors can receive one bit of the 10-bit binary signal D0-D9. The 10-bit binary signal D0-D9 can turn on one of the 1024 rows of the 10-series transistors such that one of the 1024 voltage levels can be output to an output end of the DAC 301. It is noted that the N-channel transistors shown in FIG. 3 can be replaced with P-channel transistors to form a PDAC that is similar to the PDAC 101b.

It is noted that the DACs 201 and 301 described above in conjunction with FIGS. 2-3 are merely exemplary. Any type of DAC, e.g., an oversampling DAC, an interpolating DAC, a Delta-Sigma DAC, an R-2R DAC, a thermometer coded DAC, a hybrid DAC, a segmented DAC, or any DAC that is capable of converting digital signals to analog signals can be used.

Figure 4:
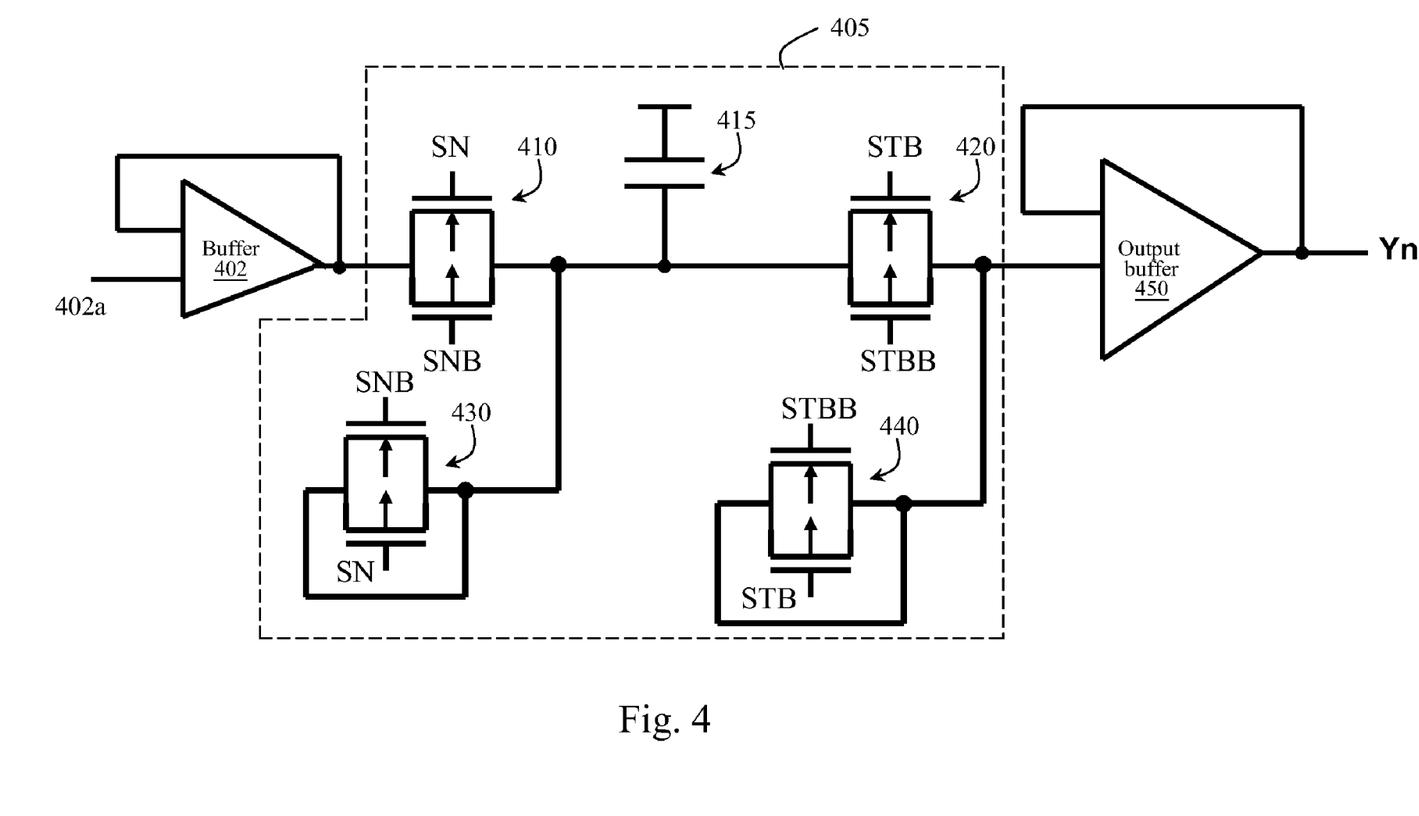
FIG. 4 is a schematic drawing illustrating an exemplary sample and hold (S/H) circuit.

FIG. 4 is a schematic drawing illustrating an exemplary sample and hold (S/H) circuit. A S/H circuit 405 can be similar to one of the S/H circuits 105. In FIG. 4, the S/H circuit 405 can be disposed between a buffer 402 and an output buffer 450. An input end 402a of the buffer 402 can be coupled with a DAC, e.g., one of the NDACs 101a and 101c and the PDC 101b (shown in FIG. 1). The output buffer 450 can be similar to the output buffer 150.

Referring to FIG. 4, the S/H circuit 405 can include analog switches 410, 420, and a capacitor 415. The capacitor 415 can be disposed between the analog switches 410 and 420. The analog switch 410 can receive, for example, a sample signal SN and a sample bar signal SNB for sampling a signal from a DAC. The capacitor 415 can store the sampled signal from the DAC through the analog switch 410. The analog switch 420 can receive at least one control signal, e.g., a strobe signal STB and a strobe bar signal STBB for turning on the analog switch 420 outputting the signal stored in the capacitor 415 to the output buffer 450.

In embodiments, the S/H circuit 405 can include dummy analog switches 430 and 440. The dummy analog switch 430 can be coupled with an output end of the analog switch 410. The dummy analog switch 440 can be coupled with an output end of the analog switch 420. The dummy analog switches 430 and 440 can be configured to desirably reduce a charge injection and/or clock feed-through of the analog switches 410 and 420, respectively, during a transition period of the analog switches 410 and 420.

Figure 5:
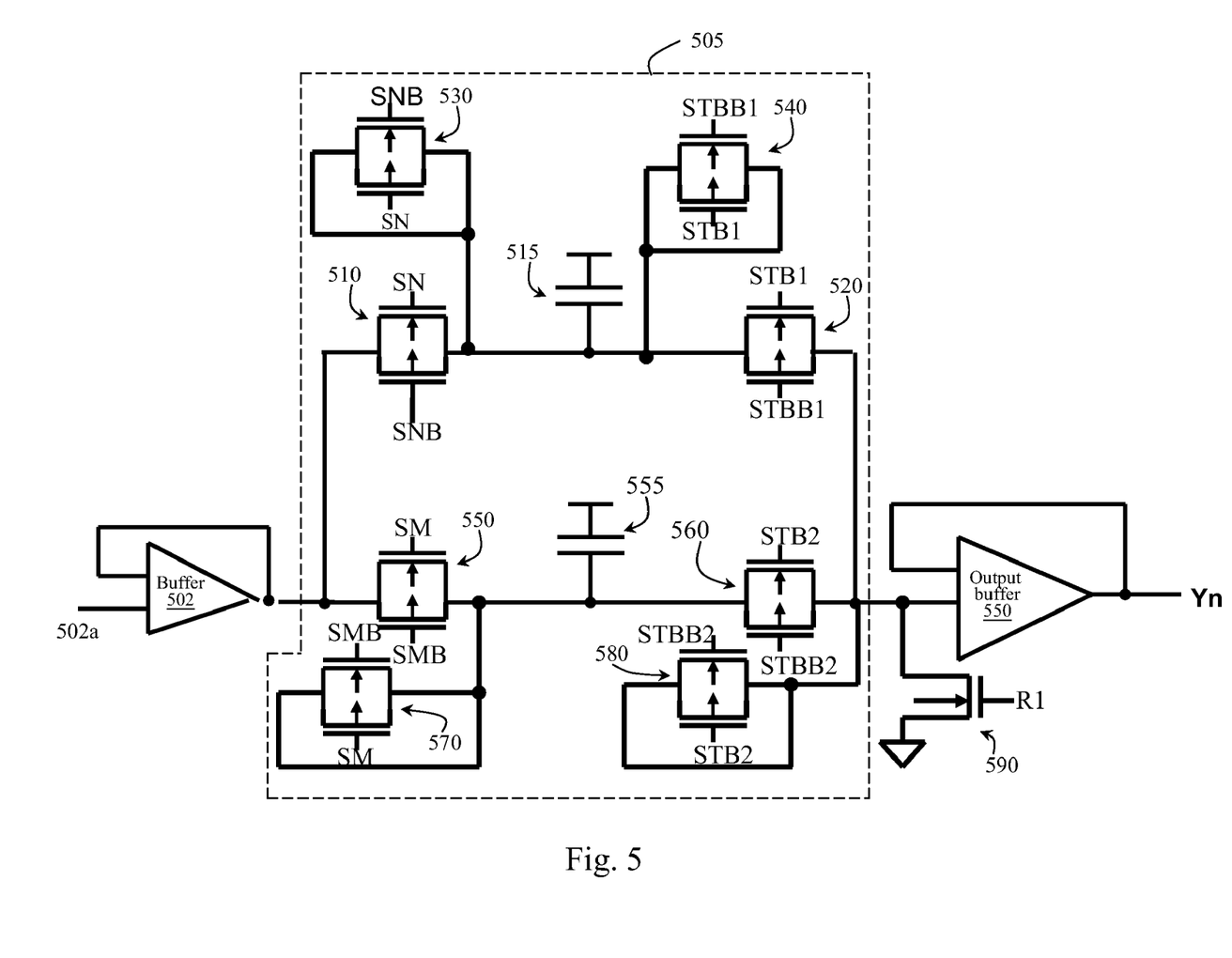
FIG. 5 is a schematic drawing illustrating an exemplary dual sample and hold (S/H) circuit.

FIG. 5 is a schematic drawing illustrating an exemplary dual sample and hold (S/H) circuit. Items of FIG. 5 that are the same items in FIG. 4 are indicated by the same reference numerals increased by 100. In FIG. 5, a S/H circuit 505 can include analog switches 510, 520, 550, 560 and capacitors 515, 555. The capacitors 515 and 555 can be disposed between the analog switches 510 and 520 and between the analog switches 550 and 560, respectively.

The analog switch 510 can receive, for example, a sample signal SN and a sample bar signal SNB for sampling a first signal from a DAC. The capacitor 515 can store the first sampled signal from the DAC. The analog switch 520 can receive at least one first control signal, e.g., a strobe signal STB1 a strobe bar signal STBB1, for turning on the analog switch 520 for outputting the first signal stored in the capacitor 515. The analog switch 550 can receive, for example, a sample signal SM and a sample bar signal SMB for sampling a second signal from the DAC. The capacitor 555 can store the second sampled signal from the DAC. The analog switch 560 can receive at least one second control signal, e.g., a strobe signal STB2 a strobe bar signal STBB2, for turning on the analog switch 560 for outputting the second signal stored in the capacitor 555. In embodiments, while the analog switch 520 is turned on, outputting the first signal stored in the capacitor 515, the analog switch 560 can be turned off. The analog switch 550 can be turned on, sampling the second signal from the DAC that can be stored in the capacitor 555. In embodiments, the S/H circuit 505 can be referred to as a dual S/H circuit. The dual S/H circuit can have a desirably enhanced operating speed.

In embodiments, a transistor 590 can be disposed between an input end of the output buffer 550 and ground or supply voltage VSS. The transistor 590 can be configured to receive a control signal R1. After the analog switch 520 outputs the first signal stored in the capacitor 515 and before the analog switch 560 outputs the second signal stored in the capacitor 555, the control signal R1 can turn on the transistor 590 coupling the input end of the output buffer 550 with the ground or supply voltage VSS. The coupling can reset and/or clean the voltage level on the input end of the output buffer 550.

In embodiments, the S/H circuit 505 can include dummy analog switches 530, 540, 570, and 580. The dummy analog switches 530, 540, 570, and 580 can be configured to desirably reduce a charge injection and/or clock feed-through of the analog switches 510, 520, 550, and 560, respectively, during a transition period of the analog switches 510, 520, 550, and 560.

Figure 6:
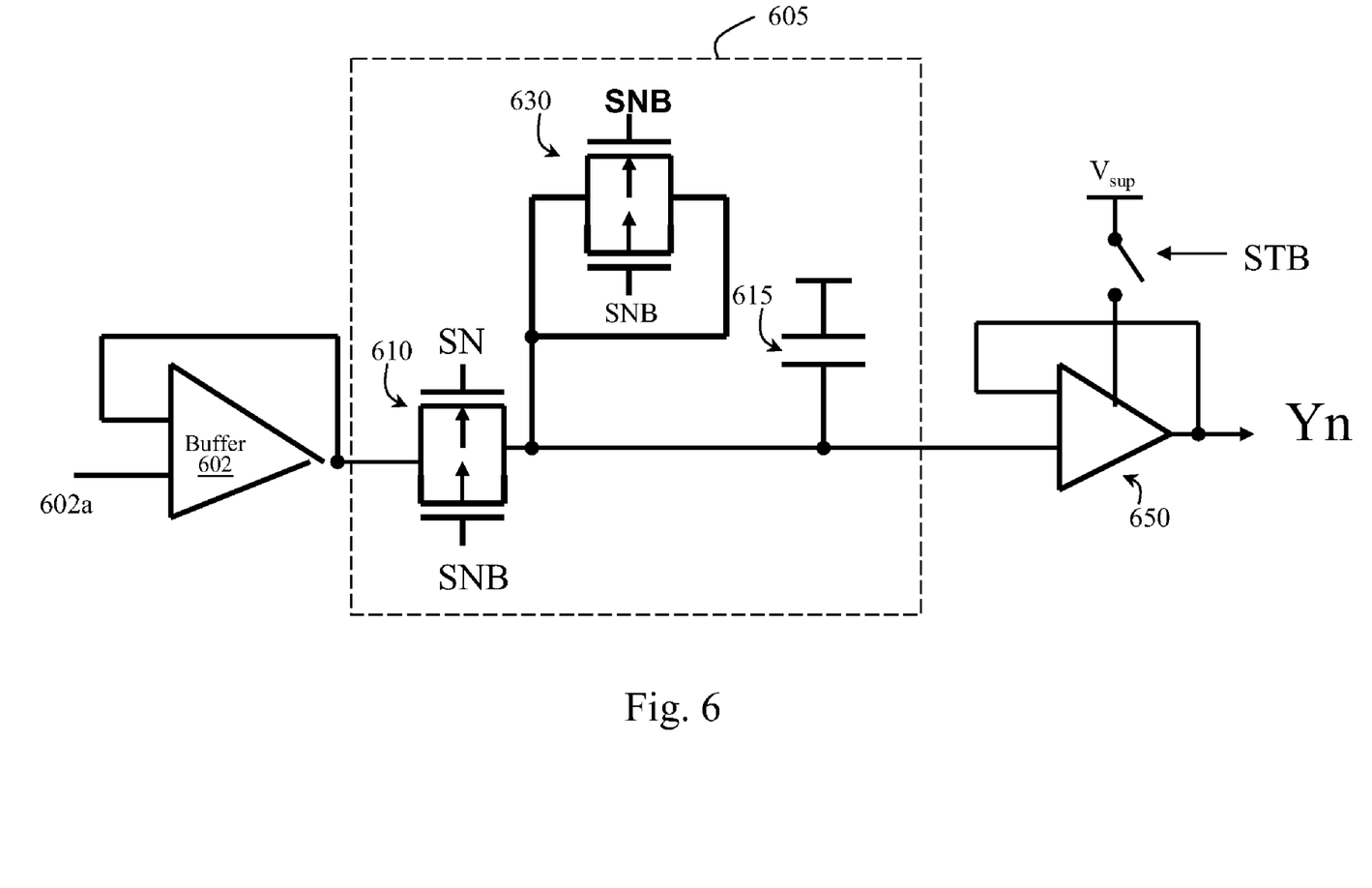
FIG. 6 is a schematic drawing illustrating another exemplary S/H circuit coupled with an output buffer.

FIG. 6 is a schematic drawing illustrating another exemplary S/H circuit coupled with an output buffer. Items of FIG. 6 that are the same items in FIG. 4 are indicated by the same reference numerals increased by 200. In FIG. 6, a control signal, e.g., a strobe signal STB, can trigger an output buffer 650 for outputting the signal stored in a capacitor 615. In embodiments, the strobe signal STB can close a switch (not labeled), coupling the output buffer 650 with a supply voltage $V_{sup}$ for releasing the signal stored in the capacitor 615.

Figure 7:
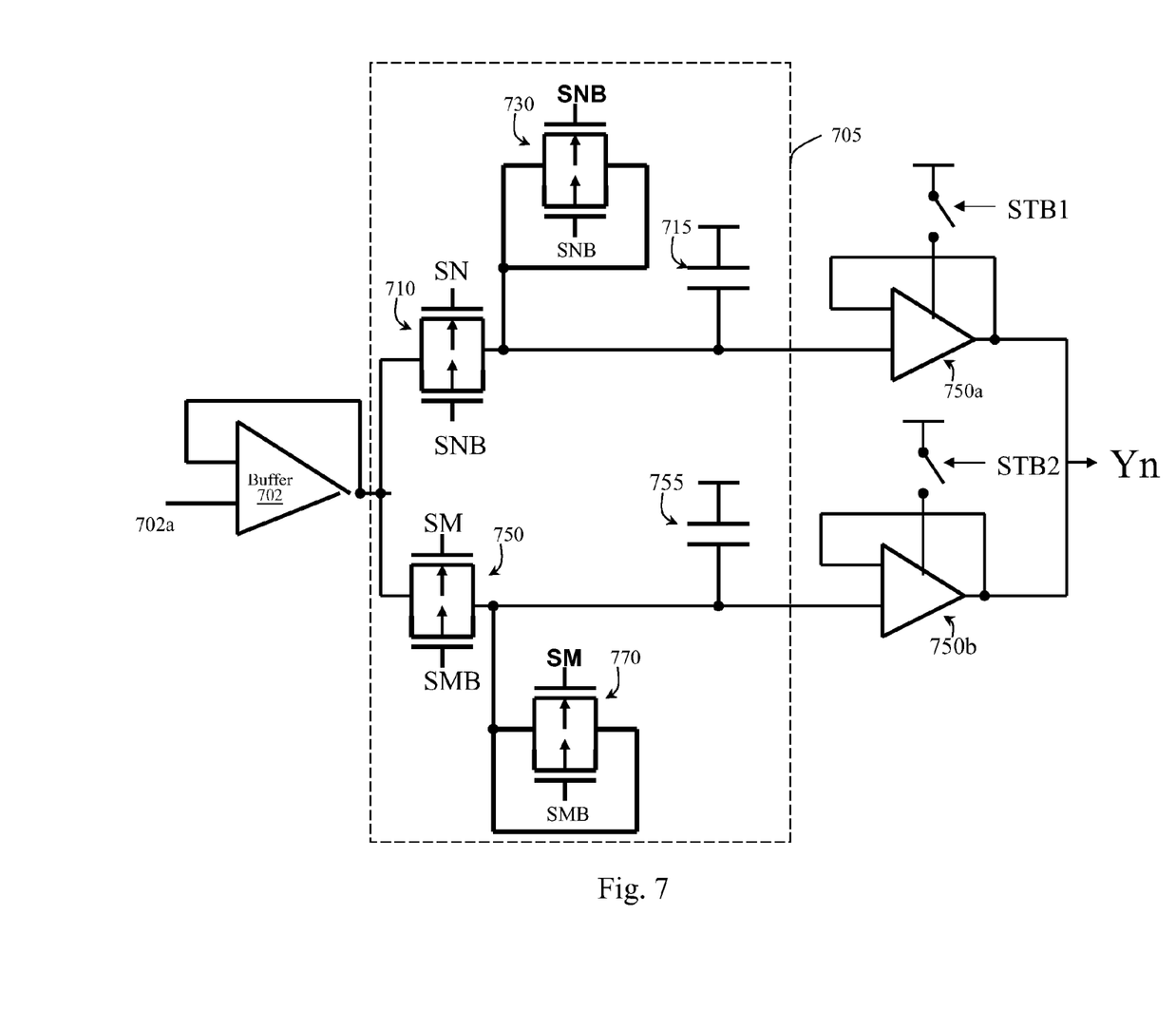
FIG. 7 is a schematic drawing illustrating another exemplary dual S/H circuit coupled with output buffers.

FIG. 7 is a schematic drawing illustrating another exemplary dual S/H circuit coupled with output buffers. Items of FIG. 7 that are the same items in FIG. 5 are indicated by the same reference numerals increased by 200. In FIG. 7, control signals, e.g., strobe signals STB1 and STB2, can trigger output buffers 750a and 750b, for outputting signals stored in capacitors 715 and 755, respectively. In embodiments, each of the strobe signals STB1 and STB2 can close a switch (not labeled), coupling the output buffers 750a and 750b with a supply voltage $V_{sup}$ for releasing the signals stored in the capacitors 715 and 755, respectively.

In embodiments, the analog switch 710 can receive at least one sample signal, e.g., a sample signal SN and a sample bar signal SNB, for sampling a first signal from a DAC. The capacitor 715 can store the first sampled signal from the DAC. The analog switch 750 can receive at least one sample signal, e.g., a sample signal SM and a sample bar signal SMB, for sampling a second signal from the DAC. The capacitor 755 can store the second sampled signal from the DAC. While the switch coupled with the output buffer 750a is closed for outputting the first signal stored in the capacitor 715 through the output buffer 750a, the switch coupled with the output buffer 750b is opened. The second signal stored in the capacitor 755 can be held while the first signal stored in the capacitor 715 is output. The operating speed of the S/H circuit 705 can be desirably enhanced.

Figure 8:
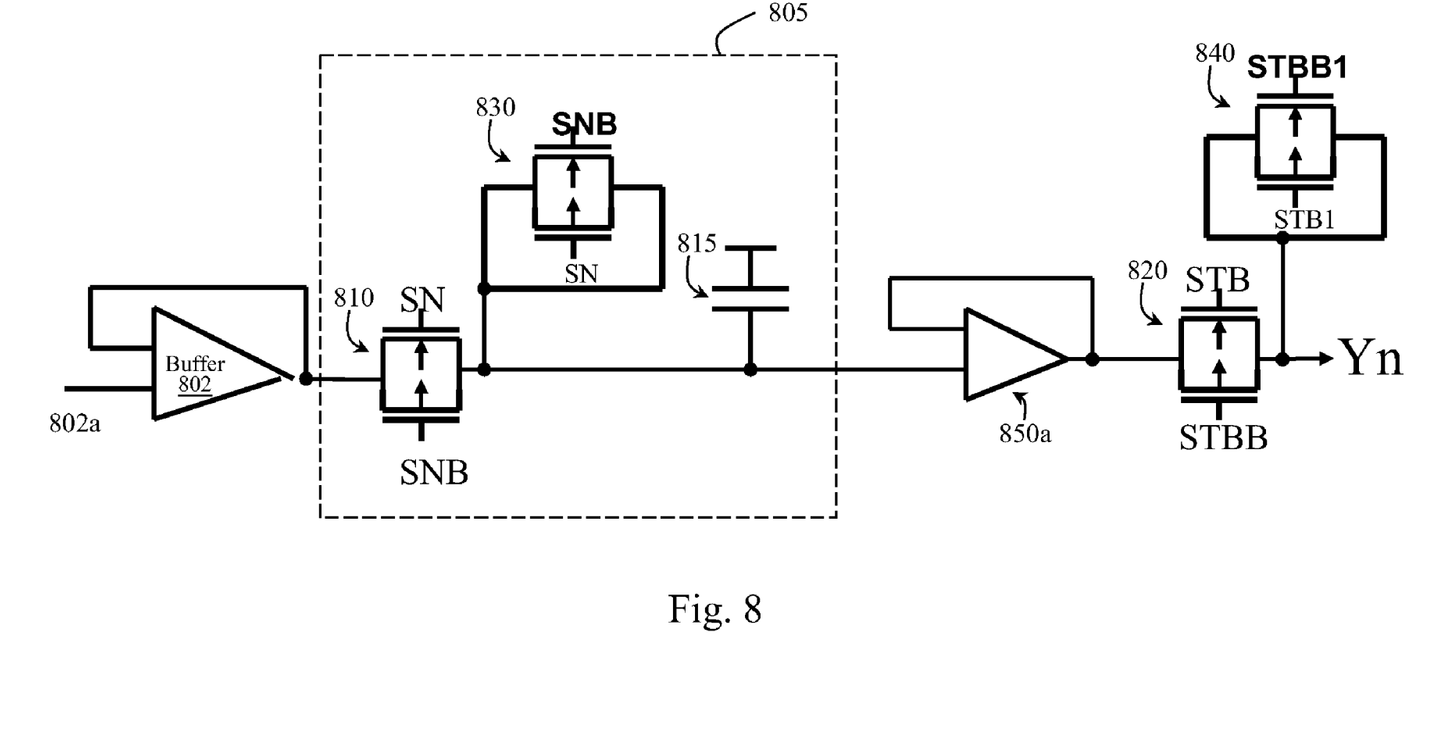
FIG. 8 is a schematic drawing illustrating an exemplary S/H circuit coupled with an output buffer.

FIG. 8 is a schematic drawing illustrating an exemplary S/H circuit coupled with an output buffer. Items of FIG. 8 that are the same items in FIG. 4 are indicated by the same reference numerals increased by 400. In FIG. 8, an output buffer 850a can be disposed between a S/H circuit 805 and an analog switch 820. The analog switch 810 can receive at least one sample signal, e.g., a sample signal SN and a sample bar signal SNB, for sampling a signal from a DAC. The capacitor 815 can store the sampled signal from the DAC. The analog switch 820 can receive at least one control signal, e.g., a strobe signal STB a strobe bar signal STBB, for turning on the analog switch 820 for outputting the signal stored in the capacitor 815 through the output amplifier 850a.

Figure 9:
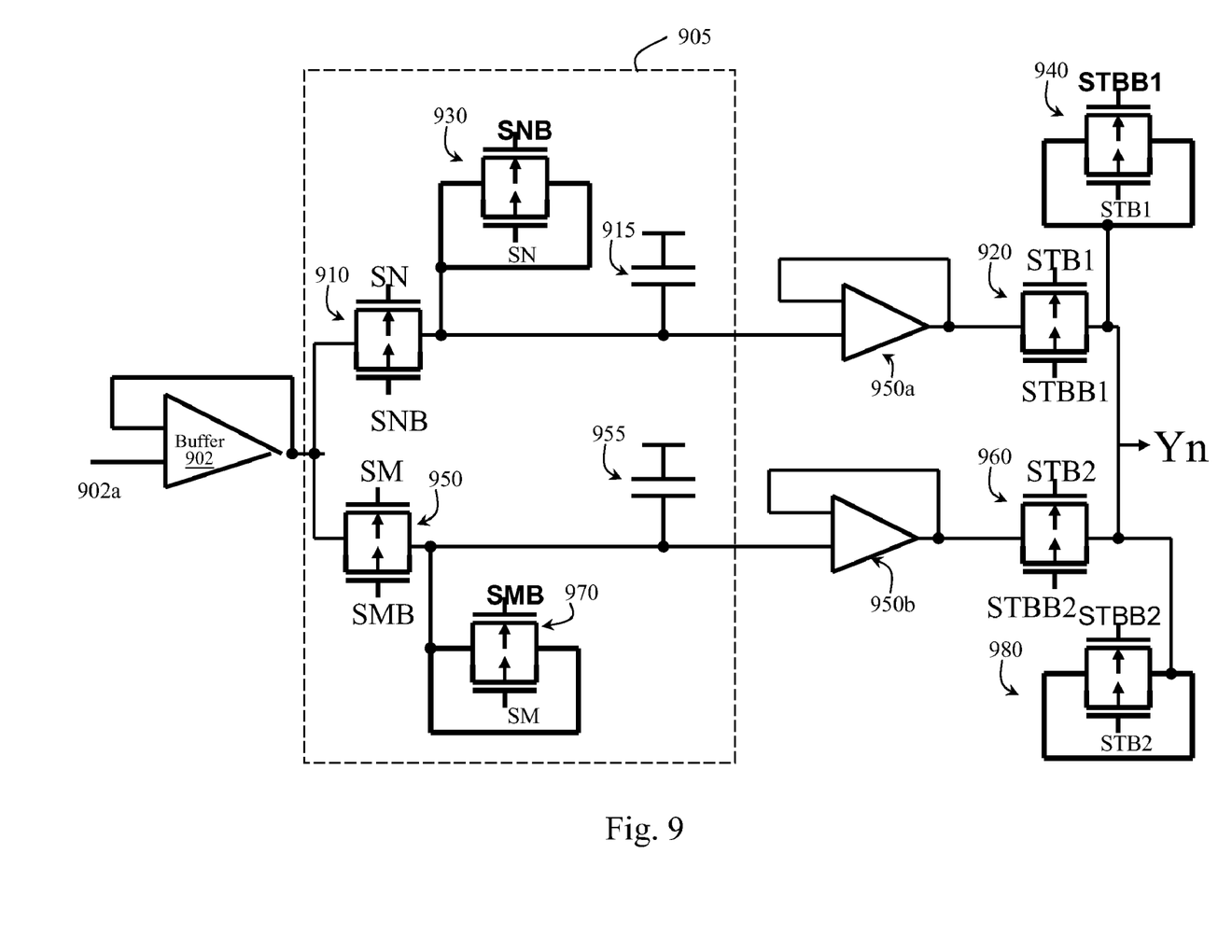
FIG. 9 is a schematic drawing illustrating an exemplary dual S/H circuit coupled with output buffers.

FIG. 9 is a schematic drawing illustrating an exemplary dual S/H circuit coupled with output buffers. Items of FIG. 9 that are the same items in FIG. 5 are indicated by the same reference numerals increased by 400. In embodiments, the analog switch 910 can receive at least one sample signal, e.g., a sample signal SN and a sample bar signal SNB, for sampling a first signal from a DAC. The capacitor 915 can store the first sampled signal from the DAC. The analog switch 950 can receive at least one sample signal, e.g., a sample signal SM and a sample bar signal SMB, for sampling a second signal from the DAC. The capacitor 955 can store the second sampled signal from the DAC. While the analog switch 920 is turned on for outputting the first signal stored in the capacitor 915 through the output buffer 950a, the analog switch 960 is turned off. The second signal stored in the capacitor 955 can be held while the first signal stored in the capacitor 915 is output.

Figure 10:
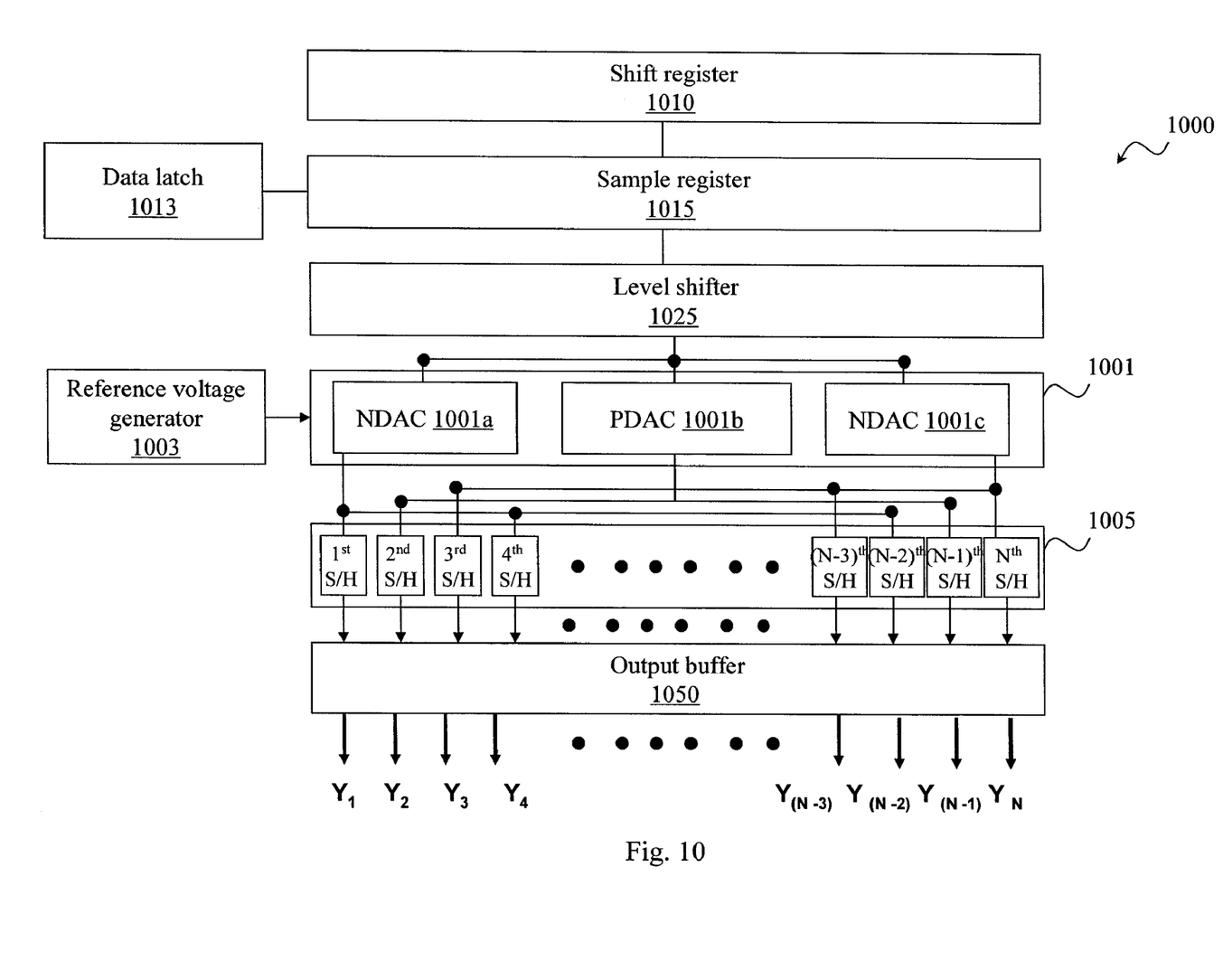
FIG. 10 is a schematic drawing illustrating another exemplary integrated circuit.

FIG. 10 is a schematic drawing illustrating another exemplary integrated circuit. Items of FIG. 10 that are the same items in FIG. 1 are indicated by the same reference numerals increased by 900. As noted, S/H circuits 1005 can hold signals from DAC circuit 1003 such that the signals can be output in parallel through an output buffer 1050. The integrated circuit 1000 can be free from including a hold register as the hold register 120 described above in conjunction with FIG. 1.

Figure 11:
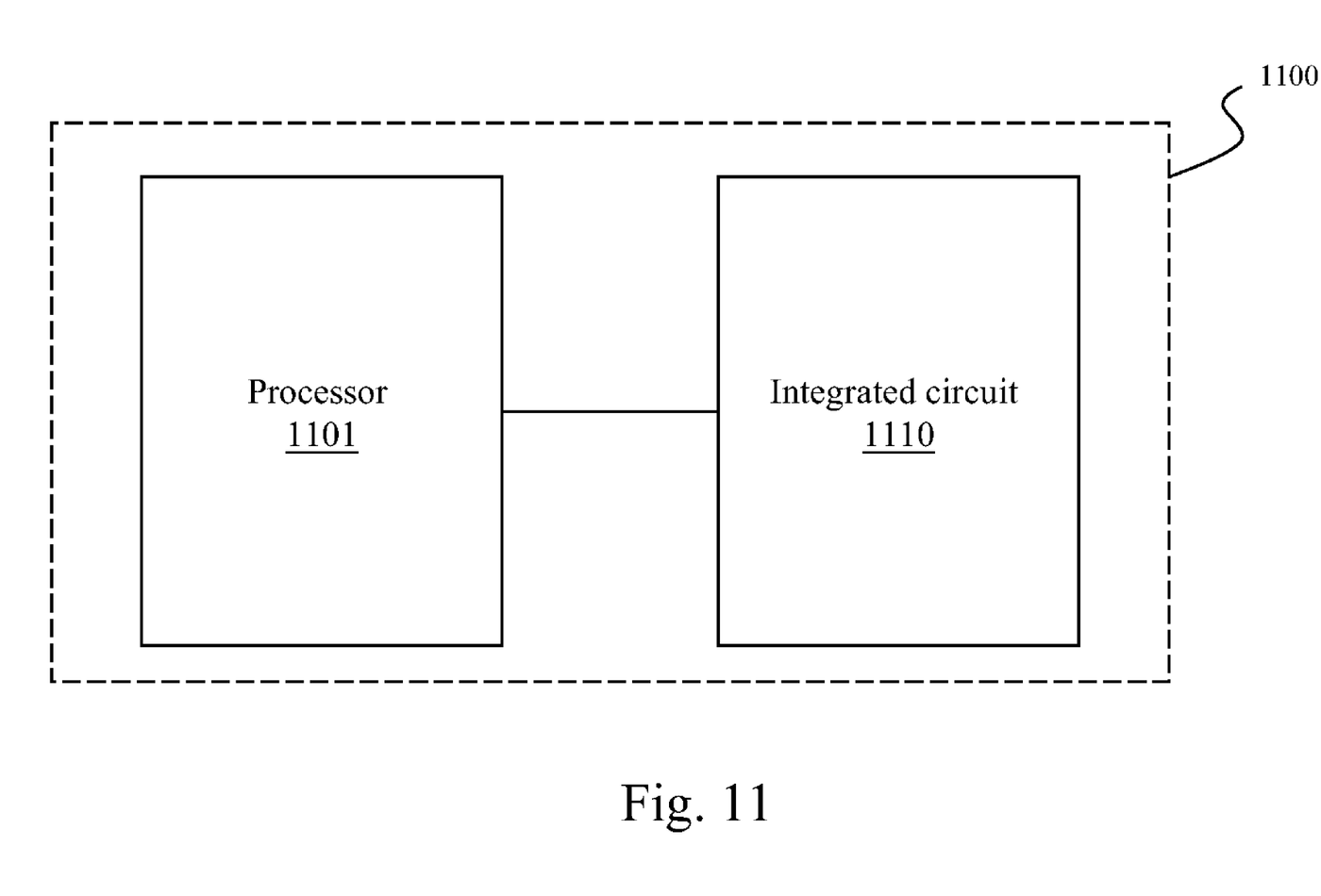
FIG. 11 is a schematic drawing showing a system including an exemplary integrated circuit coupled with a processor.

FIG. 11 is a schematic drawing showing a system including an exemplary integrated circuit coupled with a processor. In FIG. 11, a system 1100 can include a processor 1101 coupled with an integrated circuit 1110. The processor 1101 is capable of controlling the integrated circuit 1110. In embodiments, the processor 1101 can be a processing unit, central processing unit, digital signal processor, or other suitable processor. The integrated circuit 1110 can be similar to one of the integrated circuits 100 and 1000 described above in conjunction with FIGS. 1 and 10.

In embodiments, the system 1100 can include a high definition television, a vehicle, a cell phone, a set top box, a media player, a personal computer (PC), a laptop, a notebook, a personal digital assistant (PDA), a calculator, and/or any system.

In embodiments, the processor 1101 and the integrated circuit 1110 can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In embodiments, the system 1100 including the integrated circuit 1110 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
a digital-to-analog converter (DAC) circuit including at least one first channel type digital-to-analog converter (DAC) and at least one second channel type DAC; and
a plurality of sample and hold (S/H) circuits, each of the S/H circuits being coupled with the DAC circuit, the S/H circuits being capable of receiving signals from the DAC circuit and outputting the signals in parallel, wherein a number of the at least one first channel type DAC is twice of a number of the at least one second channel type DAC.

2. The integrated circuit of claim 1, wherein a total number of the at least one first channel type DAC and the at least one second channel type DAC is 3n and n is an integer from 1 to about 26.

3. The integrated circuit of claim 1, wherein the integrated circuit does not include a hold register.

4. The integrated circuit of claim 1, wherein each of the S/H circuits comprises:
a first analog switch;
a first capacitor coupled with the first analog switch, wherein the first capacitor is capable of storing a first one of the signals from the DAC circuit; and
a second analog switch, wherein the second analog switch is capable of receiving a first control signal for turning on the second analog switch for outputting the first one of the signals stored in the first capacitor.

5. The integrated circuit of claim 4, wherein each of the S/H circuits further comprises:
a third analog switch;
a second capacitor coupled with the third analog switch, wherein the second capacitor is capable of storing a second one of the signals from the DAC circuit; and
a fourth analog switch, wherein the fourth analog switch is capable of receiving a second control signal for turning on the fourth analog switch for outputting the second one of the signals stored in the second capacitor.

6. The integrated circuit of claim 1, wherein each of the S/H circuits comprises:
a first analog switch; and
a first capacitor coupled with the first analog switch, wherein the first capacitor is capable of storing a first one of the signals from the DAC circuit, the first capacitor is coupled with a first output buffer, and a first control signal is capable of turning on the first output buffer for outputting the first one of the signals stored in the first capacitor.

7. The integrated circuit of claim 6, wherein each of the S/H circuits further comprises:
a second analog switch; and
a second capacitor coupled with the second analog switch, wherein the second capacitor is capable of storing a second one of the signals from the DAC circuit, the second capacitor is coupled with a second output buffer, and a second control signal is capable of turning on the second output buffer for outputting the second one of the signals stored in the second capacitor.

8. The integrated circuit of claim 1 further comprising:
a first output buffer coupled with one of the S/H circuits, wherein each of the S/H circuits comprises:
a first analog switch; and
a first capacitor disposed between the first analog switch and the first output buffer, wherein the first capacitor is capable of storing a first one of the signals from the DAC circuit; and
a second analog switch coupled with the first output buffer, wherein the second analog switch is capable of receiving a first control signal for outputting the first one of the signals stored in the first capacitor.

9. The integrated circuit of claim 8 further comprising:
a second output buffer coupled with the one of the S/H circuits, wherein each of the S/H circuits further comprises:
a third analog switch; and
a second capacitor disposed between the third analog switch and the second output buffer, wherein the second capacitor is capable of storing a second one of the signals from the DAC circuit; and
a fourth analog switch coupled with the second output buffer, wherein the fourth analog switch is capable of receiving a second control signal for outputting the second one of the signals stored in the second capacitor.

10. The integrated circuit of claim 1, wherein at least one of the at least one first channel type DAC or at least one second channel type DAC further comprises a plurality of rows of serial transistors.

11. A system comprising:
a processor; and
an integrated circuit coupled with the processor, the integrated circuit comprising:
a digital-to-analog converter (DAC) circuit including at least one first channel type DAC and at least one second channel type DAC; and
a plurality of sample and hold (S/H) circuits, each of the S/H circuits being coupled with the DAC circuit, the S/H circuits being capable of receiving signals from the DAC circuit and outputting the signals in parallel, wherein a number of the at least one first channel type DAC is twice of a number of the at least one second channel type DAC.

12. The system of claim 11, wherein a total number of the at least one first channel type DAC and the at least one second channel type DAC is 3n and n is an integer from 1 to about 26.

13. The system of claim 11, wherein the integrated circuit is free from including a hold register.

14. The system of claim 11, wherein each of the S/H circuits comprises:
a first analog switch;
a first capacitor coupled with the first analog switch, wherein the first capacitor is capable of storing a first one of the signals from the DAC circuit; and
a second analog switch, wherein the second analog switch is capable of receiving a first control signal for turning on the second analog switch for outputting the first one of the signals stored in the first capacitor.

15. The system of claim 14, wherein each of the S/H circuits further comprises:
a third analog switch;
a second capacitor coupled with the third analog switch, wherein the second capacitor is capable of storing a second one of the signals from the DAC circuit; and
a fourth analog switch, wherein the fourth analog switch is capable of receiving a second control signal for turning on the fourth analog switch for outputting the second one of the signals stored in the second capacitor.

16. The system of claim 11, wherein each of the S/H circuits comprises:
a first analog switch; and
a first capacitor coupled with the first analog switch, wherein the first capacitor is capable of storing a first one of the signals from the DAC circuit, the first capacitor is coupled with a first output buffer, and a first control signal is capable of turning on the first output buffer for outputting the first one of the signals stored in the first capacitor.

17. The system of claim 16, wherein each of the S/H circuits further comprises:
a second analog switch; and
a second capacitor coupled with the second analog switch, wherein the second capacitor is capable of storing a second one of the signals from the DAC circuit, the second capacitor is coupled with a second output buffer, and a second control signal is capable of turning on the second output buffer for outputting the second one of the signals stored in the second capacitor.

18. The system of claim 11, wherein the integrated circuit further comprises:
a first output buffer coupled with one of the S/H circuits, wherein each of the S/H circuits comprises:
a first analog switch; and
a first capacitor disposed between the first analog switch and the first output buffer, wherein the first capacitor is capable of storing a first one of the signals from the DAC circuit; and
a second analog switch coupled with the first output buffer, wherein the second analog switch is capable of receiving a first control signal for outputting the first one of the signals stored in the first capacitor.

19. The system of claim 18, wherein the integrated circuit further comprises:
a second output buffer coupled with the one of the S/H circuits, wherein each of the S/H circuits further comprises:
a third analog switch; and
a second capacitor disposed between the third analog switch and the second output buffer, wherein the second capacitor is capable of storing a second one of the signals from the DAC circuit; and
a fourth analog switch coupled with the second output buffer, wherein the fourth analog switch is capable of receiving a second control signal for outputting the second one of the signals stored in the second capacitor.

20. The system of claim 11, wherein at least one of the at least one first channel type DAC or at least one second channel type DAC further comprises a plurality of rows of serial transistors.

* * * * *